(12) United States Patent
Beseth et al.

(10) Patent No.: US 6,927,983 B1
(45) Date of Patent: Aug. 9, 2005

(54) ELECTRONIC EQUIPMENT MODULE APPARATUS AND METHOD

(75) Inventors: Jeffrey L. Beseth, Raymore, MO (US); Jared S. Klein, Overland Park, KS (US); Paul J. Rollheiser, Kansas City, MO (US)

(73) Assignee: Garmin International, Inc., Olathe, KS (US)

( * ) Notice: Subject to any disclaimer, the term of this patent is extended or adjusted under 35 U.S.C. 154(b) by 0 days.

(21) Appl. No.: 10/746,740

(22) Filed: Dec. 24, 2003

Related U.S. Application Data

(62) Division of application No. 10/086,578, filed on Feb. 28, 2002, now Pat. No. 6,700,787.

(51) Int. Cl.[7] .............................................. H05K 7/10
(52) U.S. Cl. ..................... 361/796; 361/786; 361/752; 361/730; 211/41.17; 439/680
(58) Field of Search ............................... 361/728–731, 361/752, 785, 786, 788, 796, 797; 174/50; 211/41.17; 439/680, 681

(56) References Cited

U.S. PATENT DOCUMENTS

| | | | | |
|---|---|---|---|---|
| 3,533,045 A | * | 10/1970 | Henschen .................... | 439/62 |
| 3,676,747 A | | 7/1972 | Jorgensen et al. .......... | 361/784 |
| 4,385,333 A | * | 5/1983 | Hasler ..................... | 360/97.03 |
| 4,493,146 A | | 1/1985 | Cronin ........................ | 29/857 |
| 4,598,336 A | * | 7/1986 | Hehl ........................... | 361/725 |
| 4,702,712 A | * | 10/1987 | Ghorbani et al. ........... | 439/596 |
| 4,800,462 A | * | 1/1989 | Zacher et al. ............... | 361/786 |
| 4,821,145 A | * | 4/1989 | Corfits et al. ............... | 361/692 |
| 5,019,947 A | * | 5/1991 | Pelzl ........................... | 361/802 |
| 5,091,823 A | | 2/1992 | Kanbara et al. ............. | 361/697 |
| 5,388,030 A | | 2/1995 | Gasser et al. ............... | 361/818 |
| 5,438,482 A | | 8/1995 | Nakamura et al. .......... | 361/818 |
| 6,320,744 B1 | | 11/2001 | Sullivan et al. ............. | 361/685 |
| 6,356,441 B1 | | 3/2002 | Claprood .................... | 361/685 |
| 6,385,053 B1 | * | 5/2002 | Parizi et al. ................. | 361/786 |
| 6,771,514 B1 | * | 8/2004 | Elg ............................. | 361/786 |

\* cited by examiner

*Primary Examiner*—Kamand Cuneo
*Assistant Examiner*—Dameon E. Levi
(74) *Attorney, Agent, or Firm*—Devon A. Rolf

(57) ABSTRACT

An electronic equipment module includes a symmetrical casting with two chassis units. Each unit includes a mounting recess to receive a circuit assembly, separated by a cover applied to either unit, or both. The module is normally mounted to a unit rack, and typically has a removably attachable, re-orientable keyed surface which mates with another keyed surface on the rack. A mounting system includes a unit rack coupled to at least one electronic equipment module and a mounting frame. A method of mounting an electronic equipment module includes inserting the module into an open end of a unit rack, electrically coupling connectors attached to the module and the rack, securing the module to the rack, and attaching the rack to a mounting frame. The module can be secured to the rack by engaging a cam lever attached to the module.

21 Claims, 10 Drawing Sheets

ELECTRONIC EQUIPMENT MODULE APPARATUS AND METHOD

RELATED APPLICATIONS

The present application is a divisional and claims priority benefit, with regard to all common subject matter, of an earlier-filed U.S. patent application entitled ELECTRONIC EQUIPMENT MODULE APPARATUS AND METHOD, Ser. No. 10/086,578, filed Feb. 28, 2002 now U.S. Pat. No. 6,700,787. The identified earlier-filed application is hereby incorporated by reference into the present application.

FIELD OF THE INVENTION

The invention relates generally to apparatus and methods for mounting electronic equipment. More particularly, the invention relates to apparatus and methods for mounting avionic equipment in an aircraft.

BACKGROUND OF THE INVENTION

Electronic equipment and devices in general are being incorporated into increasingly smaller packages. In the aviation industry, instrumentation and other electronic equipment operates in an ever more integrated and autonomous fashion. Such equipment, termed "avionics", or the electronic instrumentation devices used in an aviation setting (including electronic sensors, communications equipment, navigation equipment, and displays), is therefore also subject to trends in miniaturization and integration, as used in aircraft of all sizes.

Pricing of electronic equipment for aircraft is competitive, and not all aircraft require the same combination of instrumentation options. To lower costs and increase the number of end user options, more flexibility in avionic equipment packaging is needed, as well as consistency. In response to these needs, avionics have moved toward modular installations. For example, a communication system, a transponder, and a navigation system can each be manufactured as separate modules, which are individually selected for an aircraft based on cost and the needs of the particular application. Modular designs are individually replaceable, which facilitates aftermarket upgrades, and inexpensive replacement/repair operations.

Because of the limited space available on any given aircraft, designers and manufacturers tend to locate avionic modules in areas of the aircraft where space is at less of a premium. Areas commonly used for avionics installation include the rear of the aircraft, or the nose compartment. Because the pilot or other operator is typically located remotely from the modules, controls and data displays for the modules mounted to the aircraft instrument panel are typically linked to the operator through various communications media, such as wires, fiber optics, and the like.

Space constraints are accommodated by locating electronic modules in remote areas of the aircraft. However, such locations make installation, repair, and replacement more difficult, and more expensive. Additionally, when avionics modules are located remotely from the aircraft instrument panel, longer communication lines are needed to exchange data and commands with the operator in the cockpit. Longer communication lines increase the difficulty of installation, as well as the risk of communication line failure due to vibration, physical movement, and other factors.

In some aircraft, the avionics modules are mounted directly to the instrument panel, with displays and controls located on the front of the module, similar to the way stereo equipment is installed in an automobile. Such configurations reduce problems due to long communication lines, however, other limitations arise.

When avionics modules are mounted directly to the instrument panel, space considerations become more significant due to the presence of aircraft controls directly behind the panel, such as yoke controls and ventilation ducts, for example. Displays and controls for the modules must also be located in a relatively limited space below the top of the instrument panel, so as not to impair the pilot's vision. Additionally, other items mounted to the instrument panel must be avoided when mounting displays and controls. Thus, fitting a group of modules, displays, and controls within a given area on the instrument panel requires a flexibility in mounting configurations that is lacking in current designs.

Another difficulty is encountered when electronic equipment contained within avionics modules requires repair/replacement. Each avionics module is typically of a different size and shape, and involves a different mounting apparatus. The technician is never sure of what he will find until viewing the aircraft in person, and even then, it is almost guaranteed that removing modules will be a time-consuming, labor-intensive process. Usually, several fasteners must be removed, cables re-routed, and other modules may also need removal to access desired portions of the particular module in need of repair. Finally, using many different sizes of modules increases inventory costs and tooling costs.

Therefore, there is a need in the art for apparatus, modules, methods, and systems which lend themselves to facilitating repair and replacement of electric equipment modules, such as the avionics modules used in aircraft. A mounting approach for these modules, as well as consistent design for the modules themselves, would be especially valuable. Such an approach should also provide enhanced mounting system consistency, repeatability in repair tasks, a reduction in tooling and inventory costs, and flexibility with respect to locating displays and controls associated with various modules.

SUMMARY OF THE INVENTION

The above mentioned problems with the installation, repair, and/or replacement of avionics, along with the need for mounting flexibility are addressed by the present invention, and will be understood by reading and studying the following specification. Systems, devices, and methods are provided for various avionic equipment mounting configurations and apparatus. The systems, devices, and methods of the present invention offer more convenient and more flexible mounting configurations to support increasingly efficient and integrated installation, repair, and replacement of avionics equipment, included associated displays and controls.

In one embodiment, an electronic equipment module is provided as a symmetrical casting. The electronic equipment module includes a first chassis unit which attaches to a second chassis unit. Ideally, both chassis units are identical. Each chassis unit has a mounting recess adapted to receive one or more circuit assemblies. When the chassis units are attached to each other, they typically make contact with each other along a perimeter surface which bounds each unit. However, their inner recesses can be separated by a cover applied to one unit, the other unit, or both. The circuit assemblies contained therein can include any type of electronics, such as a global positioning system (GPS) receiver, a cellular telephone, engine monitoring circuitry, airframe monitoring circuitry, atmospheric condition monitoring circuitry (e.g., air pressure, temperature), and/or any type of data acquisition, recording, monitoring, and reporting system.

The module is normally mounted within a unit rack, and thus, can have a keyed surface on its rear face which mates with a corresponding keyed surface on the interior surface of the unit rack. For increased versatility and reliability of the assembled unit racks, the keyed surfaces can be removably attachable, and re-orientable on the rear face and the interior surface. Connectors on the module can mate directly with connectors on the unit rack to which it is mounted, and the exterior surfaces of the chassis units are capable of slidable engagement with the interior surface of the unit rack.

The invention can also be embodied as an electronic equipment module mounting system, including a mounting frame, a plurality of electronic equipment modules, and a unit rack coupled to at least one of the electronic equipment modules and the mounting frame. The frame is typically mounted to some other surface, such as a cockpit instrument panel.

The invention also provides a method of mounting an electronic equipment module in a mounting frame. The method includes inserting the electronic equipment module into an open end of a unit rack, electrically coupling connectors attached to the module and the interior surface of the unit rack, securing the module to the rack, and attaching the rack to the mounting frame. The module can be secured to the rack by rotating a cam lever rotatably attached to the module into an engaged position.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are also realized and attained by means of the instrumentalities, procedures, and combinations particularly pointed out in the appended claims.

DETAILED DESCRIPTION OF THE PREFERRED EMBODIMENTS

Figure 1A:
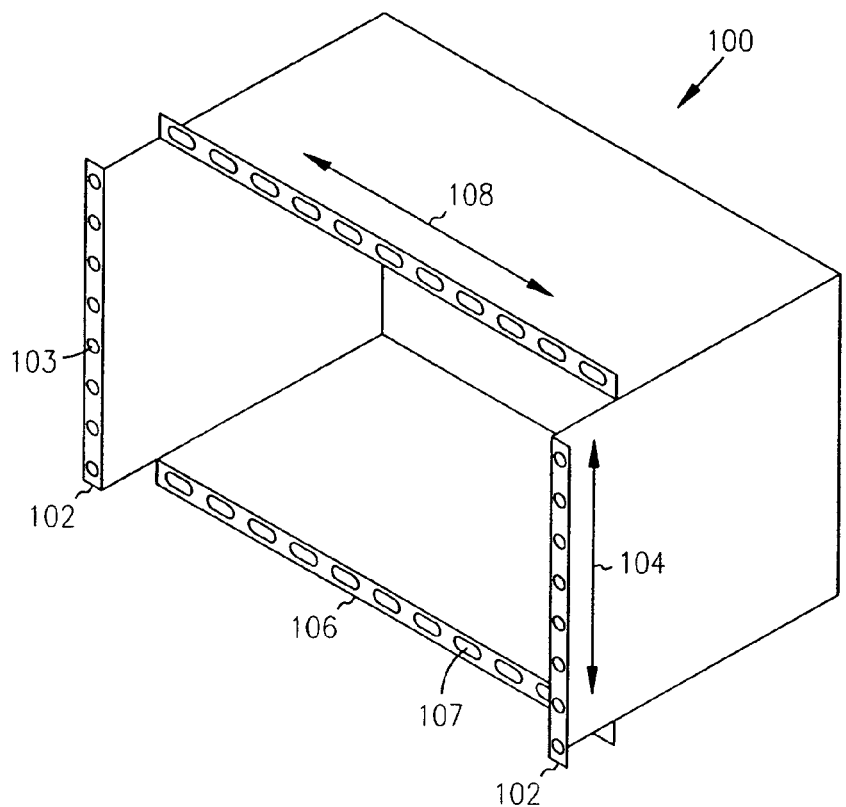
FIG. 1A is a perspective view of a mounting frame according to an embodiment of the invention.

In the following detailed description of the invention, reference is made to the accompanying drawings which form a part hereof, and in which is shown, by way of illustration, specific embodiments in which the invention can be practiced. In the drawings, like numerals describe substantially similar components throughout the several views. These embodiments are described in sufficient detail to enable those skilled in the art to practice the invention. Other embodiments can be utilized and structural, logical, and electrical changes can be made without departing from the scope of the present invention.

References to directions, such as up, down, above, or below, etc. will have their normal meaning with the ground being downward when referring to embodiments not used in aircraft. When referring to embodiments mounted to an aircraft, downwards will refer to the direction towards the floor of the aircraft (i.e., to which the landing gear is typically mounted), regardless of the orientation of the aircraft during flight. When referring to embodiments of the invention that are mounted adjacent to a mounting surface, such as an airplane instrument panel, references to the "front" of the panel will refer to a side of the panel that is intended for operator accessibility, while references to the "rear" of the panel will refer to the side of the panel that is normally towards the nose of the aircraft, and not easily accessible to an aircraft operator.

In one embodiment, the system and method of the invention for mounting electronic equipment modules is used in an aircraft, and is attached to a mounting surface within the aircraft, such as the instrument panel. Although this setting is used as an example, the mounting system and method described can be used in other settings as well without departing from the scope of the invention.

FIG. 1A is a perspective view of a mounting frame according to an embodiment of the invention. The mounting frame 100 includes a pair of first mounting surfaces 102, each with a plurality of mounting holes 103 which permit a range of assembly along the direction 104. The mounting frame 100 also includes a pair of second mounting surfaces 106, each with a plurality of mounting slots 107 what permit a range of assembly along the direction 108. In the illustrated embodiment, pairs of mounting surfaces 102, 106 are shown on opposing sides of the mounting frame 100. However, it should be understood that other configurations of mounting surfaces 102, 106 are contemplated, such as using only a single mounting surface instead of a pair of surfaces, using more than a two mounting surfaces (e.g., using three cooperating mounting surfaces), or using mounting surfaces that are not on opposing sides of the frame 100. Likewise, the mounting holes 103 and slots 107 shown in FIG. 1A are merely examples of many possible configurations which can be used for attaching items to the frame 100, using the first and second mounting surfaces 102, 106.

One skilled in the art will recognize that other configurations for mounting will also be operative to secure various items to the frame 100. The first mounting holes 103 and the second mounting slots 107 can be exchanged on their respective mounting surfaces 102 and 106. Similarly, both sets of surfaces 102, 106 can use holes 103, or both sets of surfaces 102, 106 can use slots for attaching items thereto. In one possible configuration of the invention, therefore, the first mounting holes 103 and the second mounting slots 107 can be adapted for use with a fastener such as a screw. However, other fasteners known to those skilled in the art, both temporary and permanent, such as rivets, adhesives, bolts and nuts, etc. can also be used without departing from the scope of the invention.

Figure 1B:
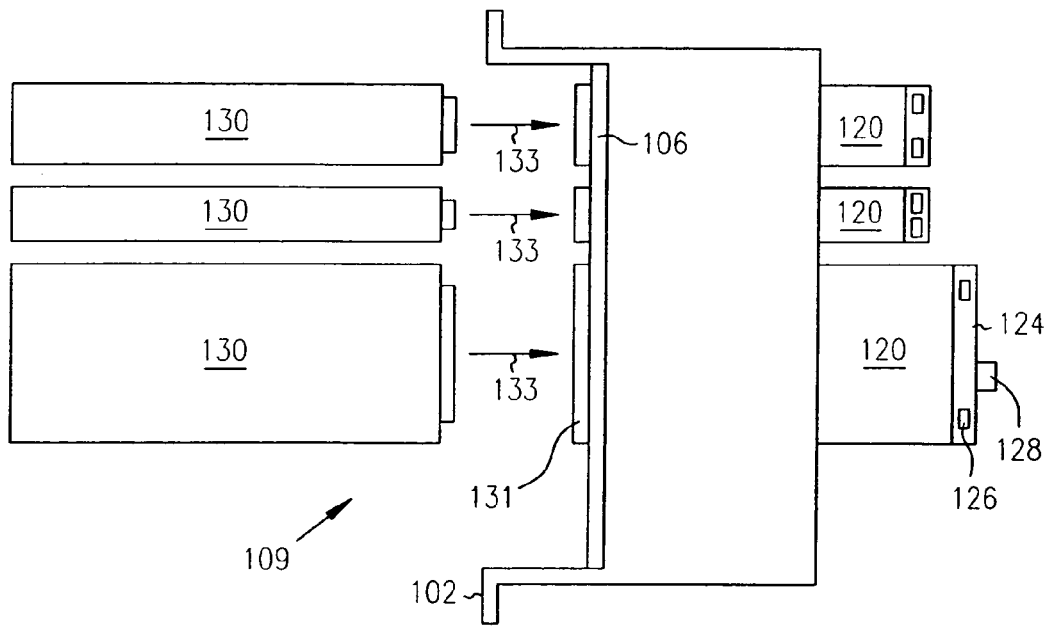
FIG. 1B is a top view of a mounting system according to an embodiment of the invention.

FIG. 1B is a top view of a mounting system 109 according to an embodiment of the invention. A number of unit racks 120 are shown. Each unit rack 120 includes a back plate 124 secured to the unit rack 120 by one or more fasteners 126. In one embodiment, the back plate 124 further includes an electrical connector 128, such as a backplane pin connector. Each unit rack 120 can be attached to the second mounting surface 106 of the mounting frame 100. Electronic equipment modules 130 are shown as insertable into the open ends 131 of, or slidably engagable with corresponding unit racks 120 along the direction of the arrows 133. Such modules 130 can include, but are not limited to including, various devices, such as a cellular telephone, an aircraft radio, a transponder, a global positioning system (GPS) receiver, engine monitoring circuitry, airframe monitoring circuitry, atmospheric condition monitoring circuitry (e.g., air pressure, temperature), and/or any type of data acquisition, recording, monitoring, and reporting system and/or other devices and equipment which processes information from sensors, acquire and dispense information, and enhance communication with an aircraft.

In one embodiment, each unit rack 120 is specifically sized to accept a corresponding electronic equipment module 130. Prior art configurations do not provide the mounting flexibility of a guided slot, such as that provided by the combination of a unit frame 120 and a backplate 124, along with the ability to tailor the size of the slot to accommodate specific electronic equipment modules 130. Rather, prior art configurations are limited to uniform module sizes.

Figure 1C:
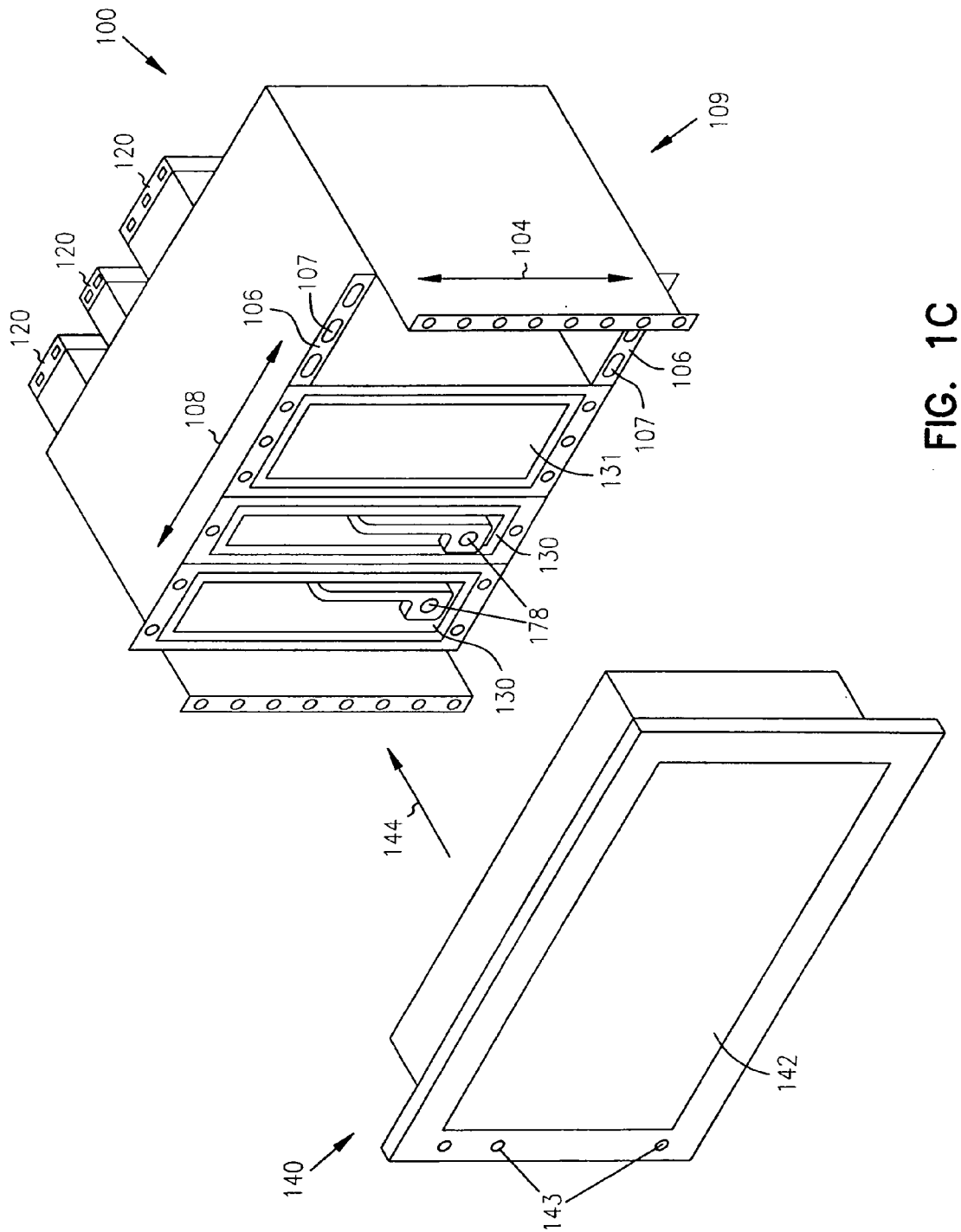
FIG. 1C is a perspective view of a mounting system according to an embodiment of the invention.

FIG. 1C is a perspective view of a mounting system 109 according to an embodiment of the invention, wherein the modules 130 are slidably engaged with, and attached to, the unit racks 120, which are in turn secured to the second mounting surfaces 106 via slots 107. As discussed above, other means of attaching the unit racks 120 to the mounting frame 100 are also contemplated.

A display unit 140, including a flat panel, color liquid crystal display (LCD) screen 142, or alternate display units capable of conveying data to the operator using visual devices can be attached to the frame 100, or to an instrument panel, as will be shown in later figures. In one embodiment, the display unit 140 includes a number of controls 143 such as knobs, switches, levers, dials, and the like. The display unit 140 is shown mounted separately from the modules 130, generally following a path along the arrow 144. Mounting the display unit 140 separately accomplishes two objectives: providing additional display mounting locations, and adding flexibility with regard to the information displayed thereon. Given the construction of the frame 100, any of a number of three dimensional ranges of mounting locations are possible. Having a separately mounted display unit 140 also provides greater flexibility in the location of controls 143. Finally, providing a single display unit 140 for a number of electronic modules 130 allows information from several modules 130 to be displayed in an organized, integrated manner on the display unit 140.

As shown in FIGS. 1A and 1C, the unit racks 120 can be mounted along a range of mounting locations 108. The slots 107 of the second mounting surfaces 106 allow the unit racks 120 to be positioned to one side or the other of the mounting frame 100. This configuration allows further flexibility in locating modules 130, as well as the entire system 109, on a surface, such as a crowded cockpit instrument panel. Unit rack 120 usage permits a variety of sizes and shapes of electronic modules 130 to be mounted in various locations, while maintaining ease of replacement, since the unit racks 120 guide removal and replacement of the modules 130. As will be discussed below, the unit racks 120 can also be configured with mechanical mechanisms 178, such as cam levers, for quickly securing and releasing the modules 130 from the unit racks 120, as well as for making/breaking electrical connections as the modules 130 are inserted and removed, respectively, from the unit racks 120.

Figure 2A:
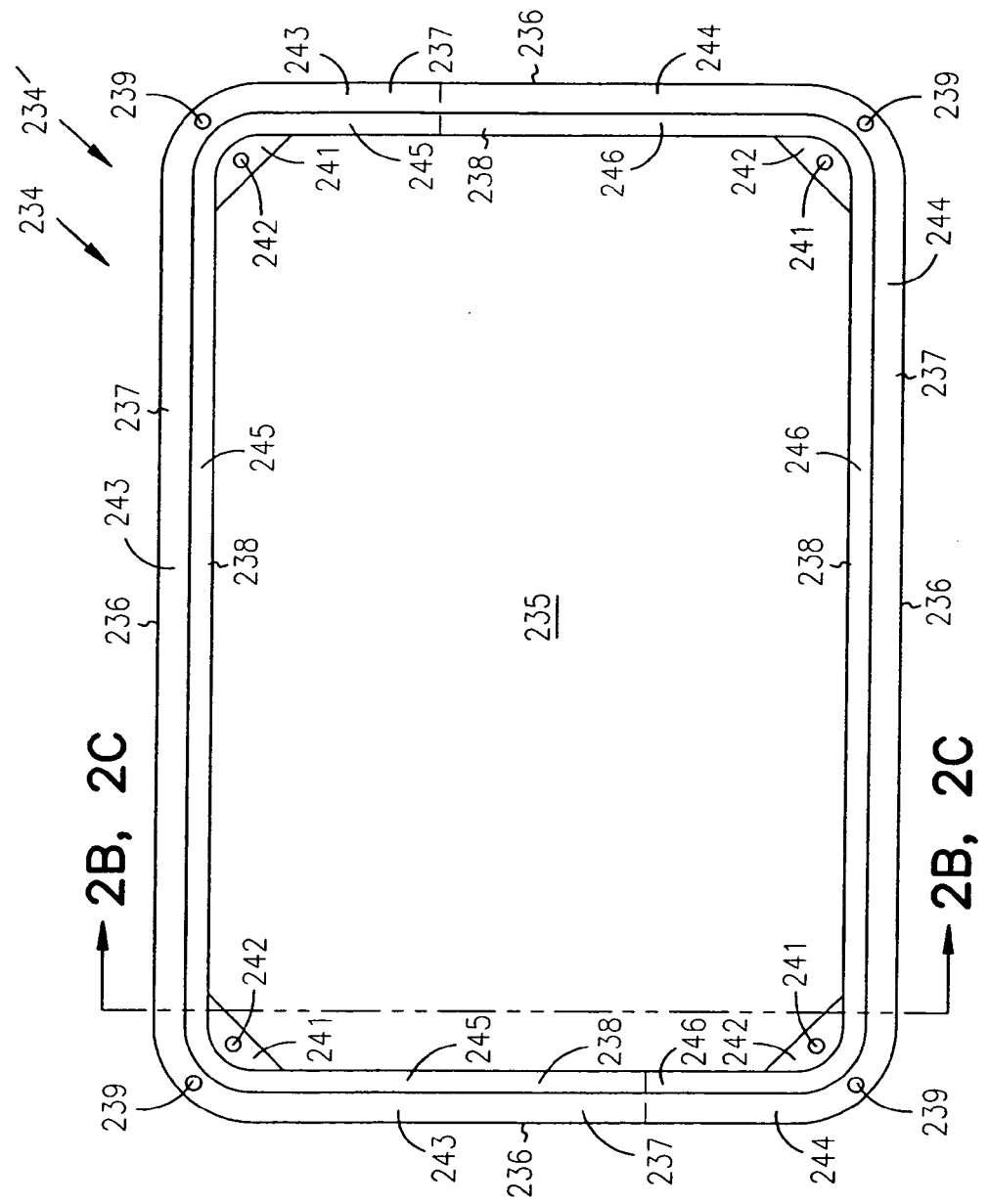
FIGS. 2A, 2B, and 2C are front plan and sectioned views, respectively, of a single chassis unit according to various embodiments of the invention.
Figure 2B:
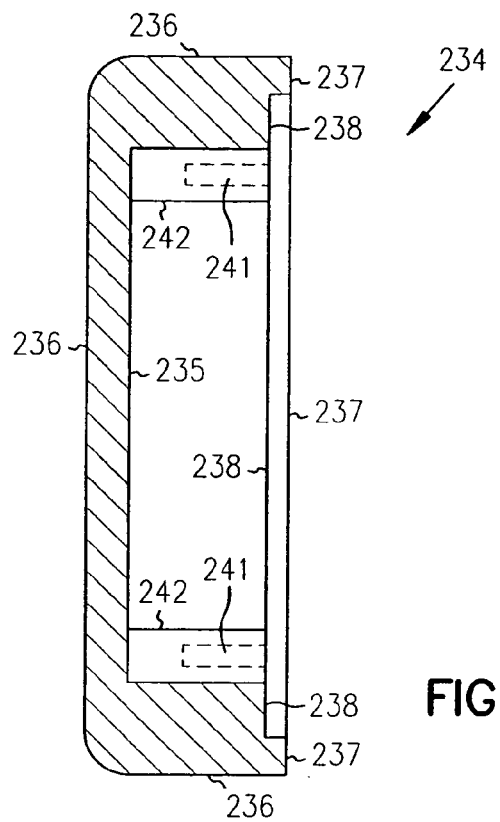

FIGS. 2A and 2B are front plan and sectioned views, respectively, of a single chassis unit according to an embodiment of the invention. The chassis unit 234 includes a first mounting recess 235 and an exterior surface 236 bounded by a perimeter 237, which can be smooth or tortuous, as shown. Thus, in FIGS. 2A and 2B it can be seen that the perimeter 237 includes a lip 238. Also located on the perimeter are a series of chassis attachment openings 239 (which are used to join or attach two chassis units together).

As will be shown in more detail below, a cover (not shown in FIGS. 2A and 2B) can be attached to the chassis unit 234 by means of a series of cover attachment openings 241 which can be included in a corresponding series of mounting towers 242. Thus, the cover can be attached to the chassis unit 234 by resting the cover on the lip 238 and applying fasteners to the cover attachment openings 241. If the cover thickness is less than dimension "Z" (i.e., the depth of the lip 238), then the cover will not rise above the level of the perimeter 237. This can be important to assuring proper operation of electronic circuitry mounted in the recess 235, with respect to containing and shielding from, electromagnetic interference (EMI). Alternatively, the mounting towers 242 can be used as a resting place for the cover, and the lip 238 can be eliminated whenever EMI suppression is less important.

Figure 2C:
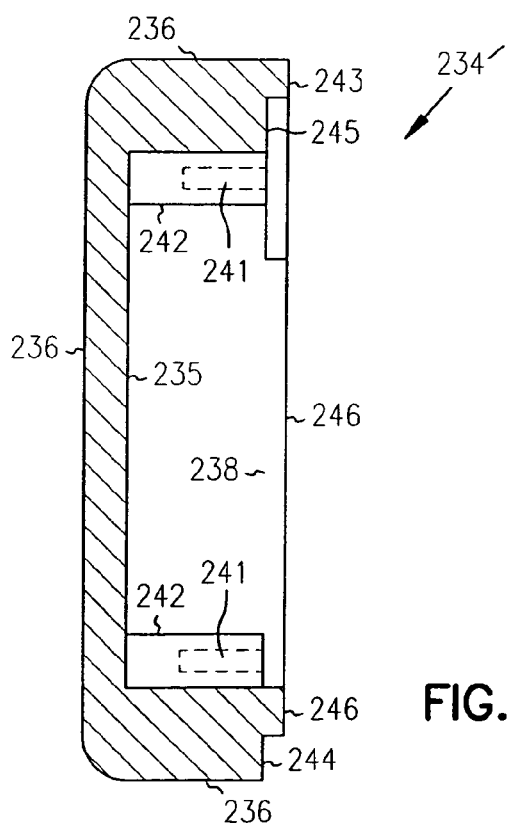

FIG. 2C is a sectioned view of a single chassis unit according to an alternative embodiment of the invention. Like FIG. 2B, FIG. 2C is also a sectioned view of FIG. 2A. However, in this case, the chassis unit 234' includes a raised perimeter 243, and a lowered perimeter 244. The chassis unit 234' also includes a lower lip 245, and an upper lip 246. In the embodiment illustrated in FIG. 2C, the perimeters 243, 244 and lips 245, 246 provide an interlocking function when two identical chassis units 234' are assembled, such that EMI supression is enhanced, and the chassis units 234' do not slide against each other. For additional EMI shielding, an a cover can also be attached to the chassis unit 234' shown in FIG. 2C by means of a series of cover attachment openings 241 which can be included in a corresponding series of mounting towers 242.

Figure 3:
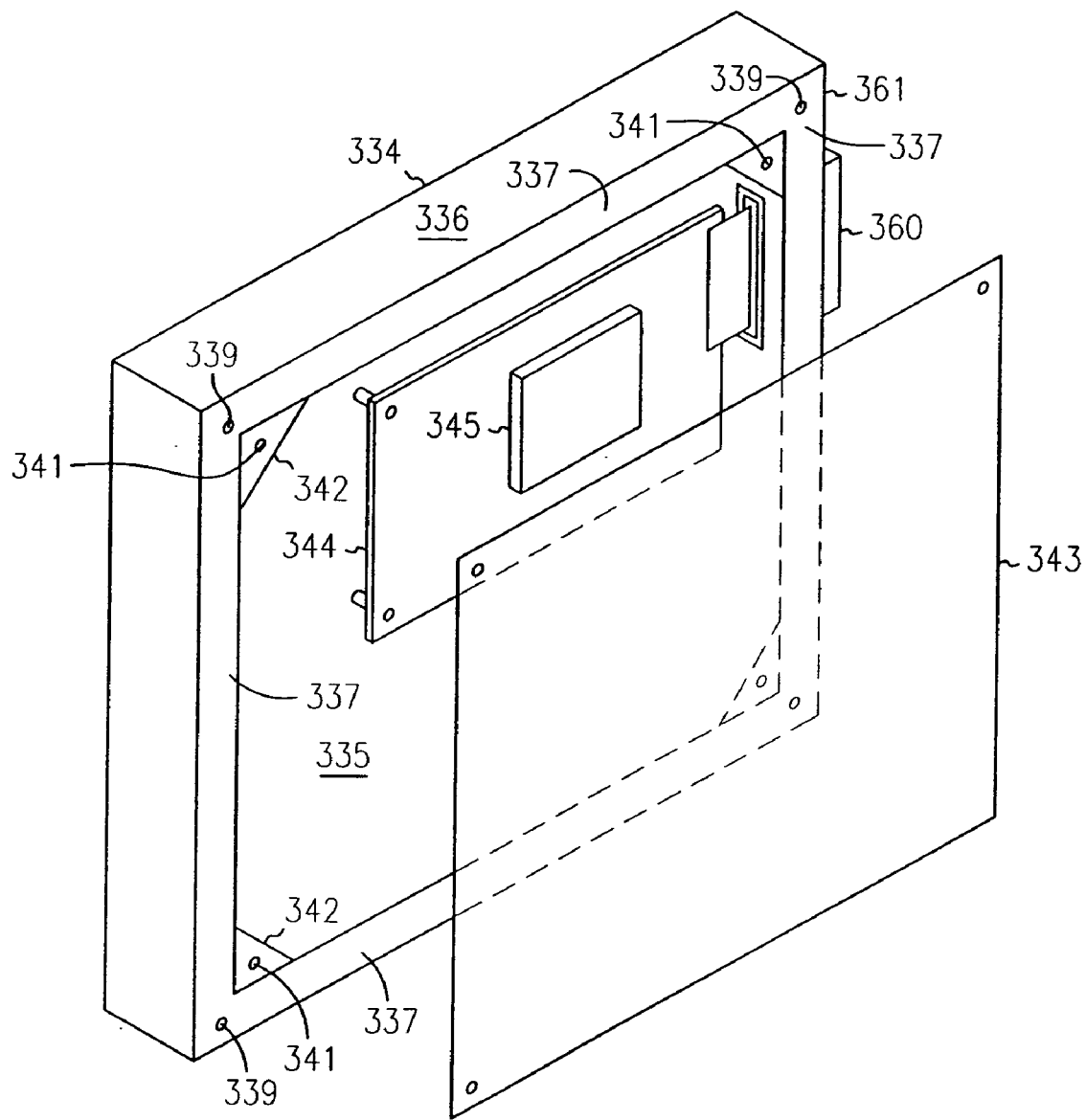
FIG. 3 is a perspective view of a single chassis unit according to an embodiment of the invention.

FIG. 3 is a perspective view of a single chassis unit according to an embodiment of the invention. In this case, the chassis unit 334 is shown with a recess 335, an exterior surface 336, and a perimeter 337. No lip is used. The chassis unit also includes several chassis attachment openings 339, cover attachment openings 341, and mounting towers 342.

In this case, the cover 343 is shown. Typically, the thickness of the cover 243 will be less than the distance from the top of the mounting towers 342 to the perimeter 337, so that the cover will rest on the towers when attached to the chassis unit 334, without protruding above the level of the perimeter, as explained above.

If desired, one or more electronic circuit assemblies 344 can be completely enclosed within the combination of the chassis unit 334 and the cover 343. The assemblies 344 can include any type of electronic circuitry 345, such as a cellular telephone, a computer, a memory or disk drive unit, a transponder, a global positioning system (GPS), engine monitoring circuitry, airframe monitoring circuitry, atmospheric condition monitoring circuitry (e.g., air pressure, temperature), and/or any type of data acquisition, recording, monitoring, and reporting system, etc. Such assemblies 344 are typically placed in electronic communication with one or more connectors 360 mounted to the rear face 361 of the chassis unit 334.

Figure 4A:
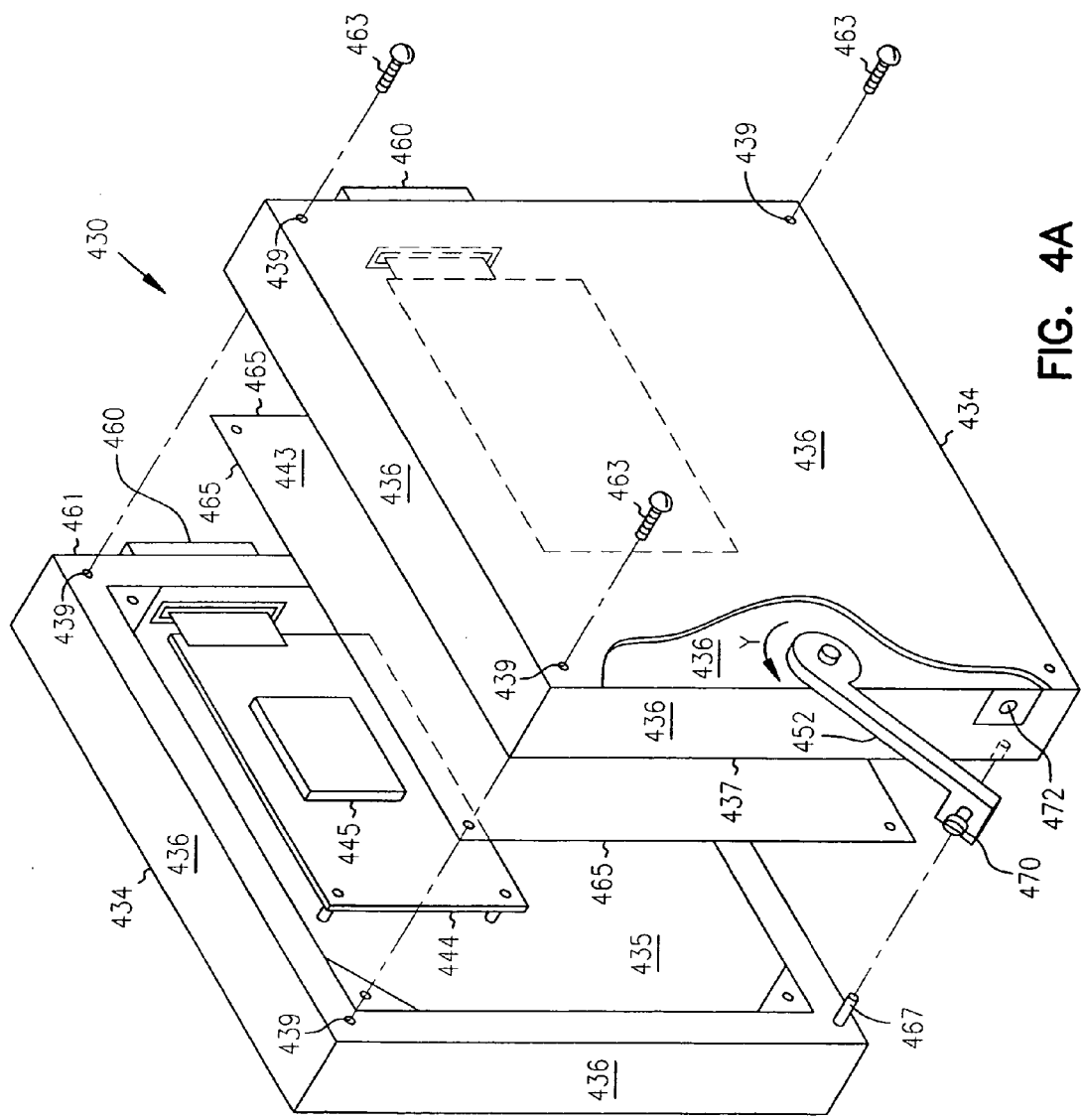
FIGS. 4A and 4B are exploded and assembled views, respectively, of an electronic equipment module according to an embodiment of the invention.
Figure 4B:
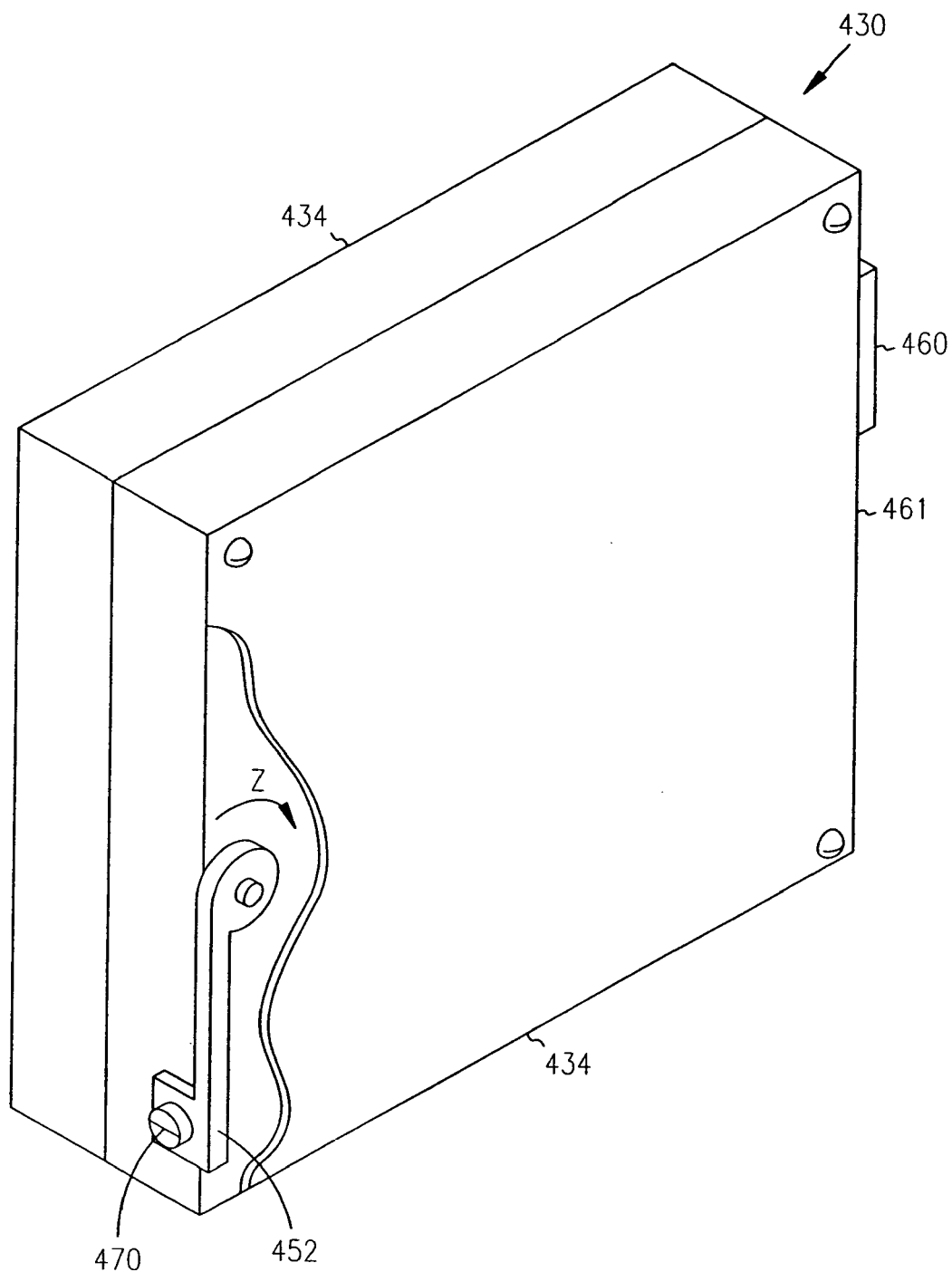

FIGS. 4A and 4B are exploded and assembled views, respectively, of an electronic equipment module according to an embodiment of the invention. The electronic equipment module 430 includes a pair of chassis units 434. Each chassis unit 434 has a mounting recess 435 adapted to receive at least one circuit assembly 444, such as engine and/or airframe monitoring circuitry 445. Each chassis unit 434 also has an exterior surface 436 bounded by a perimeter, and optionally, a cam lever 452 which can be used to secure the chassis unit to a unit rack (shown in FIG. 1). In FIG. 4A, the cam lever is shown in the non-engaged position. Each chassis 434 unit typically also has one or more connectors 460 mounted to its rear face 461 for communicating with the circuit assemblies 444 mounted therein. As noted previously, each chassis unit 434 can have a cover 443 attached, although only a single cover 443 is shown in FIG. 4A.

The chassis units 434 are joined together to form a module 430 using a series of fasteners 463. In this case, the fasteners 463 shown are screws which pass through some portion of the chassis attachment openings 439, until the fasteners reach a threaded portion of the openings 439. After engaging the threads, the fasteners exit the openings 439 of the first chassis unit 434 and enter the threaded portion of the openings 439 in a second chassis unit 434. In this manner, the chassis units 434 are removably attached to one another. The fasteners, or joining means, for attaching the cover 443 to the chassis unit 434, as well as those fasteners used to attach one chassis unit 434 to another unit 434, can be screws, bolts and nuts, rivets, adhesives, etc. When the chassis units 434 are assembled into a module 430, and the cover 443 is disposed between the chassis units 434, the perimeters 437 of the chassis units 434 completely bound the outer edge 465 of the first cover, and the perimeters 437 of the chassis units 434 are in contact along their entire length. A pin, protrusion, or other keying device 467 can be used to orient the chassis units 434 properly before assembly into a module 430, used in conjunction with, or obviating the need for, one or more of the fasteners 463. Of course, as discussed previously, the chassis units 434 can included interlocking perimeters and lips (as shown in FIG. 2C) for additional EMI suppression, and non-sliding assembly.

In FIG. 4B, an assembled module 430 can be seen. Typically, the cam lever 452 is rotated in the "Y" arrow direction to secure the module 430 into a unit rack, and in the "Z" arrow direction to release the module 430 from the unit rack (see FIG. 1C). As the module 430 is inserted into the unit rack, the connectors 460 mounted on the rear faces 461 of the chassis units 434 engage corresponding connectors in the unit rack. Referring back to FIG. 1C, it can be seen that once the module 430 is secured within a corresponding unit rack (similar to or identical to the rack 120), the rack can be mounted to the frame 100 using screws or other fasteners. Alternatively, the rack can first be mounted to a frame, and then the module 430 can be secured within the rack. The cam lever 452 can be secured by a fastener 470, which can be a screw or locking fastener received by an orifice 472 (shown in FIG. 4A).

Figure 5:
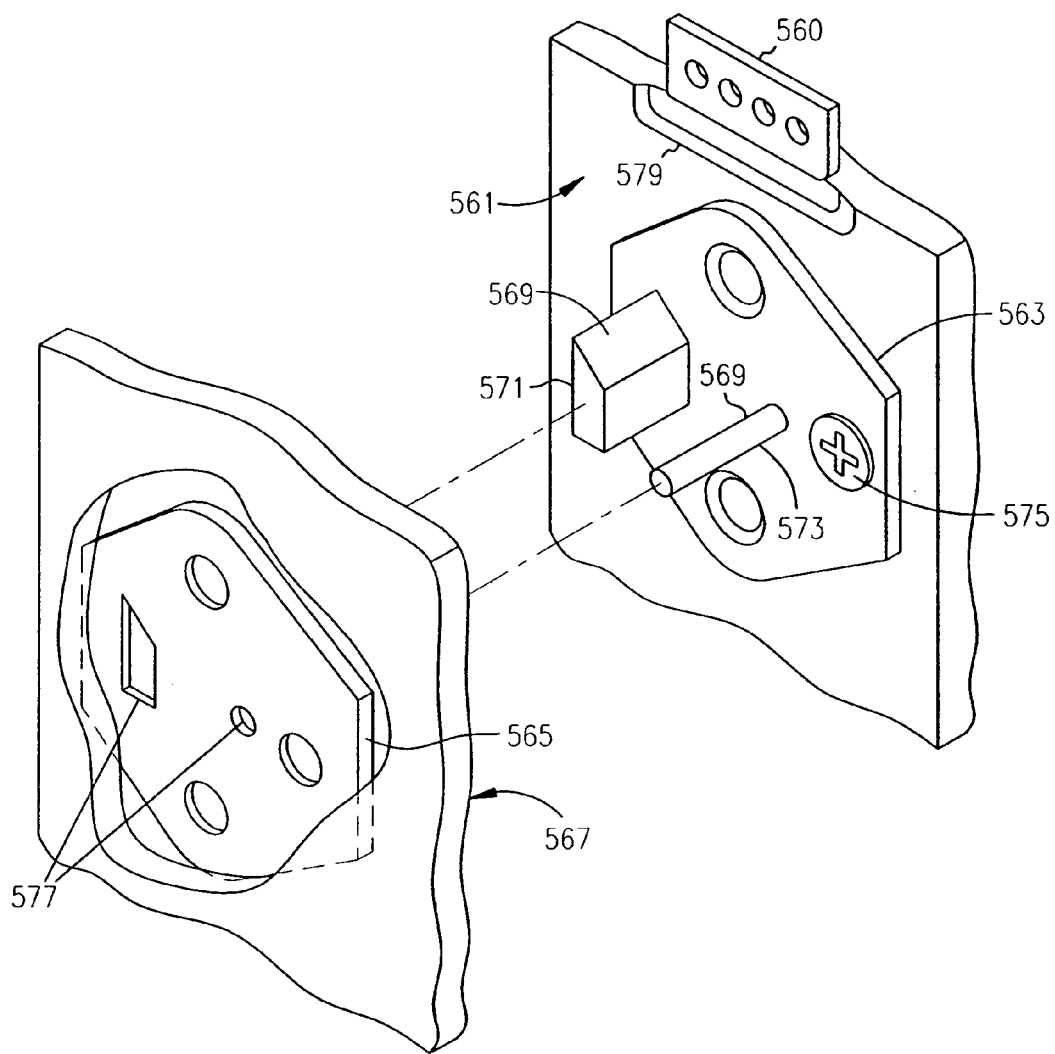
FIG. 5 is a detailed perspective view of various keyed surfaces according to an embodiment of the invention.

FIG. 5 is a detailed perspective view of various keyed surfaces according to an embodiment of the invention. Here it can be seen that a module can be constructed so as to include one or more keyed surfaces 563 on the rear face 561. The unit rack into which the module is inserted also has a keyed surface 565 located on its interior surface 567. The two keyed surfaces 563, 565 are capable of mating engagement, and thus, the various elements 569, 571 of the keyed surfaces 565, 567 tend to mirror each other in a male-female fashion. For example, the keyed surface 563 includes a non-symmetrical protrusion 571, and a symmetrical protrusion 573. Designing the keyed surface 563 in this manner allows the user of one or more mounting fasteners 575 to be used to removably attach the surface 563 to the rear face 561. For increased versatility and reliability, the keyed surface 565, if constructed in a symmetric fashion (as opposed to merely having symmetric elements 573), provides the ability to become removably re-orientable on the rear face 561. In this case, the keyed surface 565 is constructed in the form of a hexagon (other symmetric shapes, such as a square, circle, equilateral triangle, etc. can be used), can be rotated around the element 573, and re-oriented so as to locate the non-symmetric protrusion 571 in a different position on the face 561. The elements 577 of the keyed surface 565 on the interior surface 567 of the unit rack can also be manipulated in this manner to mirror the movement of the elements 569 on the keyed surface 563 of the rear face 561.

FIG. 5 also clearly shows that a chassis unit can include a connector opening 579 located on the rear face 561. A connector 560 can be mounted in the connector opening 579. Typically, the rear face 561 of the chassis unit will be designed such that the keyed surface 563 is not located within the connector 560.

Figure 6:
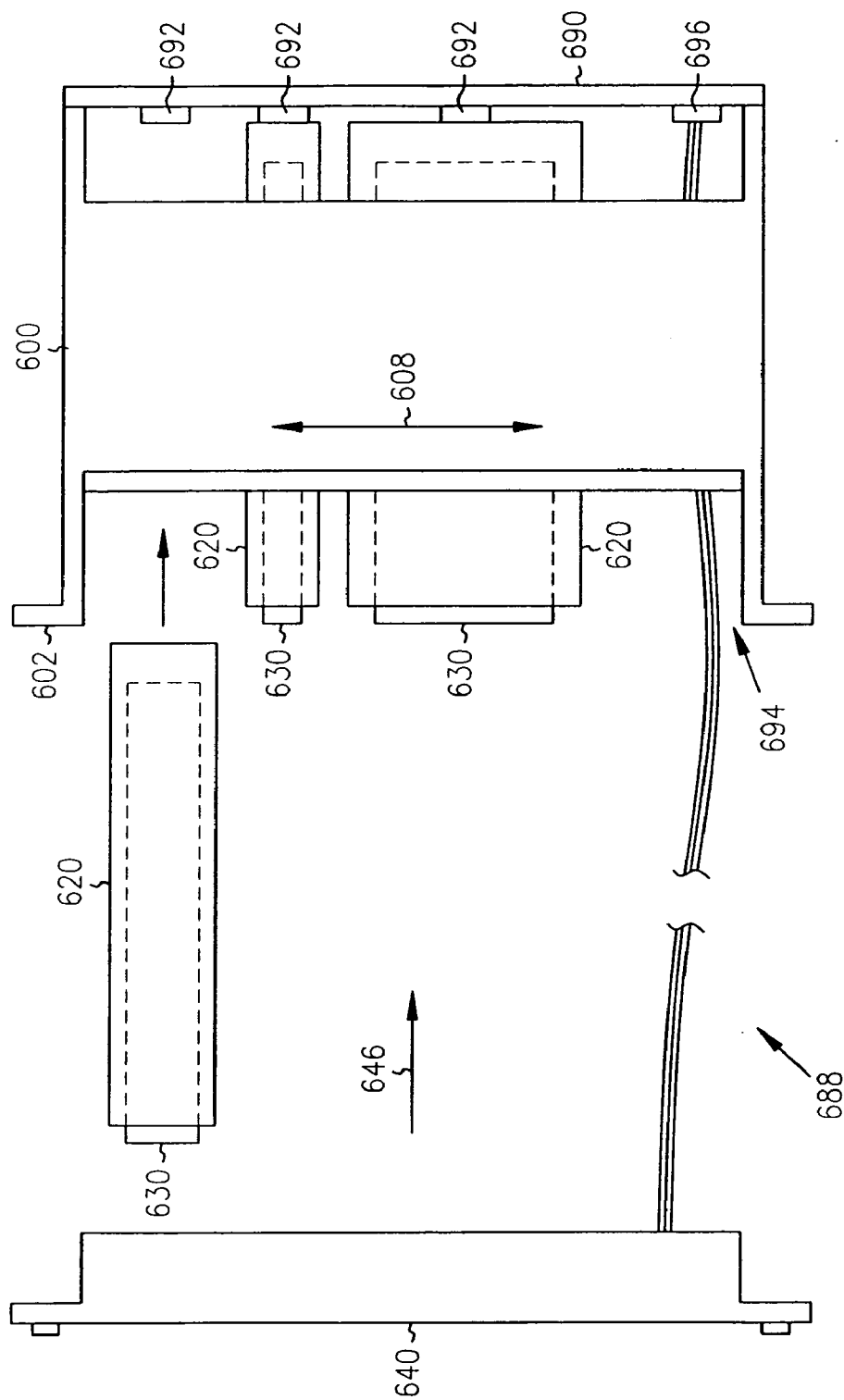
FIG. 6 is a top view of a mounting system according to an alternative embodiment of the invention.

FIG. 6 is a top view of a mounting system 688 according to an alternative embodiment of the invention. The mounting frame 600 is shown with a motherboard 690 attached to a back side. Electronic modules 630 are electrically coupled to the board connectors 692 that are in turn attached to the motherboard 690. Communication lines 694 run from a separate connector 696 on the motherboard 690 to a display unit 640.

The use of a motherboard 690 allows for greater ease of electrically connecting communication lines 694 from the modules 630 to the display unit 640. While a separate mounting frame for the display unit 640 is not needed in this configuration, the use of a motherboard dedicates board connectors 692, 696 to each electronic module 630, trading off against the flexibility of mounting locations for the electronic modules 330. To offset this tradeoff somewhat, additional communication lines 694 can be introduced as a means for connecting each unit rack 620 to the motherboard 690. In any case, the display unit 640 in one configuration can still be separately mounted on the mounting frame 600 along several ranges of mounting locations. Of course, as noted previously, the display unit 640 can also be mounted to an instrument panel, if desired.

The communication lines 694 typically include electrical wires, however alternate means of communication such as fiber optic lines, or electromagnetic radiation could also be used. In one embodiment, the communication lines 694 attach to a connector 696 such as a pin connector. Because the display unit 640 is located in close proximity to the electronic modules 630, the communication lines 694 can be routed directly, increasing reliability. Because the display unit 640 can be separately mounted to the frame 600, or to an instrument panel, the electronic modules 630 are also easily accessible for attachment of separate communication lines 694 (not shown). The installation procedure of the mounting system is therefore greatly simplified.

Thus, the invention can also be described as an electronic equipment module mounting system 688 which includes a mounting frame 600, a plurality of electronic equipment modules 630 (similar to or identical to modules 130 and 430 described hereinabove), and a unit rack 620 coupled to each of the electronic modules 630, as well as to the mounting frame 600 along a module range of mounting locations 608 with respect to the mounting frame 600. As noted above, the exterior surface of each electronic module 630 is capable of slidable engagement with an interior surface of the corresponding unit rack 620. Cam levers included in the modules 630 can be used to remove and replace or install the modules 630 with respect to the unit racks 620. A display unit 640 can be located directly in front of the electronic equipment modules 630, and placed in electronic communication with at least one of the electronic equipment modules 630, by way of connectors 692, 696, and communications lines 694. Any type of electronic circuitry can be included in the modules 630, including, for example, a GPS receiver, a cellular telephone, engine monitoring circuitry, airframe monitoring circuitry, atmospheric condition monitoring circuitry (e.g., air pressure, temperature), and/or any type of data acquisition, recording, monitoring, and reporting system.

Figure 7:
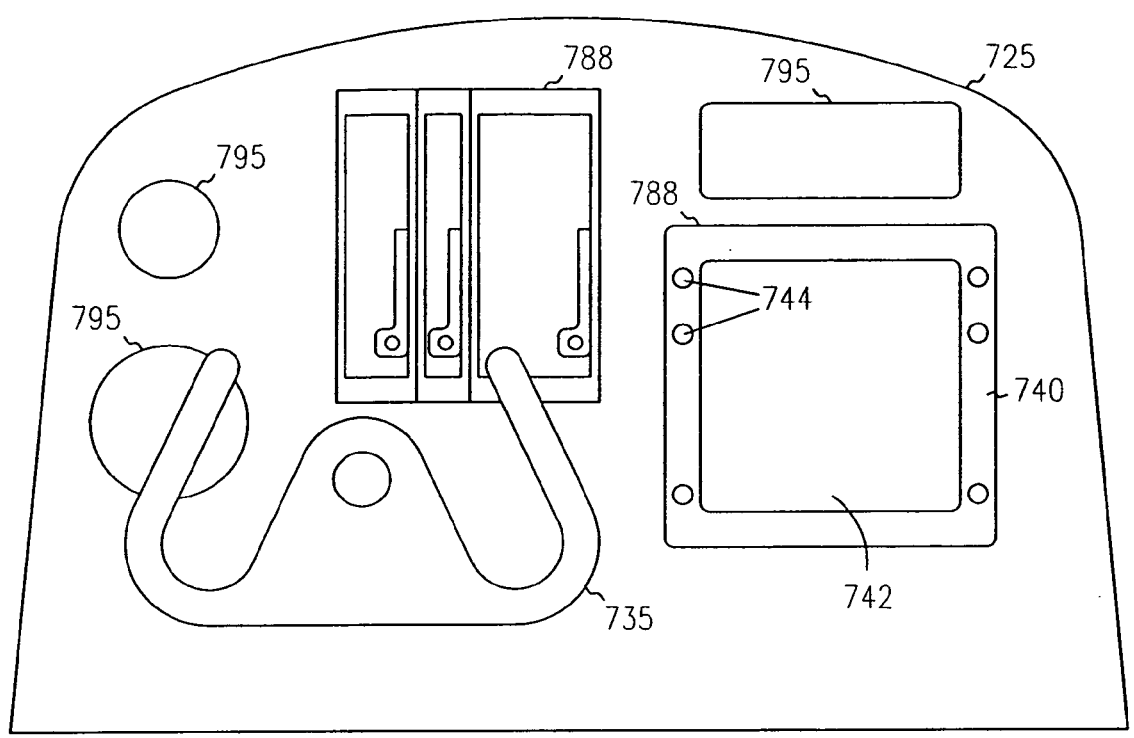
FIG. 7 is an avionic instrument panel and mounting system according to an embodiment of the invention.

FIG. 7 illustrates an avionic instrument panel as a possible mounting surface for use with the mounting system according to an embodiment of the present invention. The mounting surface, in the form of an instrument panel 725, includes a yoke 735, one or more mounting systems 788 according to the present invention, and various other instrumentation 795. The mounting systems 788 can include a display unit 740, mounted to the instrument panel 725, if desired. As can be seen from the scale of various elements shown in FIG. 7, even small amounts of flexibility in mounting location along the ranges provided by the mounting systems 788 allow a significant number of displays 742 and controls 744 to fit on crowded areas of an instrument panel 725.

Returning to FIGS. 1A–1C, 4A–3B, and 5, a method of mounting an electronic equipment module in a mounting frame can be described as follows. After one or more electronic assemblies 444 are inserted into, and received by, the recess 435 of a chassis unit, a module 630 is assembled by removably fastening or joining a pair of symmetric chassis units 434 together. A cover 465 can be attached to one or both of the chassis units 434. The procedure includes inserting the electronic module 630 into an open end 133 of a unit rack 620. Each of the modules 130 is similar to or identical to the modules 430 and 630 described previously. The method also includes electrically coupling a connector 660 attached to the electronic equipment module 630 to a connector 666 attached to the interior surface of the unit rack 620. The electronic equipment module 630 is then secured to the unit rack 620, and the rack 620 is attached to the mounting frame 600.

Securing the electronic equipment module 630 to the unit rack 620 typically includes removably fastening the equipment module 630 to the rack 620, such as by rotating a cam lever 452 rotatably attached to the module 630 into an engaged position from a non-engaged position. Electrically coupling the connectors 660, 666 to each other can occur at about the same time that the keyed surfaces 563, 565 are mated together, if included as part of the module 630.

Referring specifically to FIG. 6, it can be seen that the method can also include establishing electrical communication between a display unit 640 and an electronic equipment module 630 (via communication lines 694 and connectors 692, 696), and mounting the display unit 640 on the mounting frame 600 along a range of mounting locations 608 with respect to the electronic equipment module 630. Alternatively, the display unit 640 can be mounted to an instrument panel. Of course, each unit rack 620 can also be positioned adjacent to the mounting frame 600 along a horizontal range of mounting locations 608. Establishing electrical communication between the display unit 640 and the electronic equipment module 630 typically includes coupling a motherboard 690 between the display unit 640 and the electronic equipment module 630.

CONCLUSION

An improved module, system, and method for mounting equipment modules, such as those used to enclose avionics, have been disclosed. The inventive concept of providing varying locations for key modular components allows a single mounting system to be used in conjunction with several varieties of aircraft, within the crowded confines of an instrument panel. The system enables module horizontal movement, and simultaneously, the ability to locate the display unit horizontally or vertically. The multi-dimensional mounting flexibility of the mounting system shown allows electronic modules to be mounted in close proximity to a display unit, which greatly increases accessibility of the modules over prior configurations where modules were housed in the nose or rear of an aircraft. Installation, repair, and replacement are all greatly simplified with this configuration.

In addition, the present invention provides a module, mounting system, and method for more efficient removal and installation of electronic equipment modules, especially those used as avionics equipment modules in aircraft. A symmetric casting module, including two chassis units, is provided. The system of the invention, along with the module, allows aircraft technicians easy access to electronics located on an aircraft instrument panel, and rapid turnaround repair activity such that spare modules can be inserted and removed into their corresponding unit racks without using tools, if desired. Tooling and inventory costs are also reduced by using module parts which are symmetric, such as the chassis units and keyed surfaces.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled. Such embodiments of the inventive subject matter may be referred to, individually and/or collectively, herein by the term "invention" merely for convenience and without intending to voluntarily limit the scope of this disclosure to any single invention or inventive concept if more than one is in fact disclosed.

What is claimed is:

1. An apparatus, comprising:
   a first removable re-orientable keyed surface to mount to a face of an electronic equipment module;

a second removably re-orientable keyed surface to mount to a rack and to engage the first removably re-orientable keyed surface; and wherein the removably re-orientable keyed surfaces are not located within a connector.

2. The apparatus of claim 1, wherein the first removably re-orientable keyed surface is constructed as a shape selected from a circle, an equilateral triangle, a square, and a hexagon.

3. The apparatus of claim 1, further comprising:
a mounting fastener to attach the first removably re-orientable keyed surface to the face.

4. The apparatus of claim 1, further comprising:
a non-symmetric protrusion coupled to the first removably re-orientable keyed surface, and to be received by the second removably re-orientable keyed surface.

5. The apparatus of claim 1, further comprising:
a symmetric protrusion coupled to the first removably re-orientable keyed surface.

6. The apparatus of claim 5, wherein the first removably re-orientable keyed surface is a mirror image of the second removably re-orientable keyed surface.

7. An apparatus, comprising:
an electronic equipment module;
a first removably re-orientable keyed surface to mount to a face of the electronic equipment module and to engage a second removably re-orientable keyed surface to mount to a rack;
wherein the electronic equipment module includes a connector opening located on the face;
wherein a connector is mounted in the connector opening; and
wherein the first removably re-orientable keyed surface is not located within the connector.

8. The apparatus of claim 7, wherein the electronic equipment module further comprises:
a mounting recess to receive a circuit assembly;
an exterior surface bounded by a perimeter; and
a cover to attach to the perimeter.

9. The apparatus of claim 8, wherein the circuit assembly includes monitoring circuitry.

10. The apparatus of claim 9, wherein the monitoring circuitry includes engine monitoring circuitry.

11. The apparatus of claim 9, wherein the monitoring circuitry includes airframe monitoring circuitry.

12. The apparatus of claim 9, wherein the monitoring circuitry includes a data acquisition system.

13. A system, comprising:
a mounting frame to mount to a mounting surface;
a plurality of electronic equipment modules, wherein at least one of the electronic equipment modules includes a first chassis unit having a mounting recess to receive a circuit assembly, and a first removably re-orientable keyed surface to mount to a face of the at least one of the electronic equipment modules; and
a unit rack to couple to the at least one of the electronic equipment modules and to the mounting frame, wherein the unit rack includes a second removably re-orientable keyed surface to engage the first removably re-orientable keyed surface.

14. The system of claim 13, wherein the mounting surface includes a cockpit instrument panel.

15. The system of claim 13, wherein the at least one of the electronic equipment modules further comprises:
a second chassis unit to removably attach to the first chassis unit.

16. The system of claim 15, further comprising:
a cover to attach to the first chassis unit and to be disposed between the first chassis unit and the second chassis unit when the second chassis unit is removably attached to the first chassis unit.

17. The system of claim 15, wherein the second chassis unit is identical to the first chassis unit.

18. A method, comprising:
inserting an electronic equipment module into an open end of a unit rack, wherein the electronic equipment module includes a first removably re-orientable keyed surface to mount to a face of the electronic equipment module and to engage a second removably re-orientable keyed surface attached to the unit rack; and
mating the first removably re-orientable keyed surface to the second removably re-orientable keyed surface.

19. The method of claim 18, further comprising:
securing the electronic equipment module to the unit rack.

20. The method of claim 19, wherein securing the electronic equipment module to the unit rack includes:
rotating a cam lever rotatably attached to the electronic equipment module into an engaged position from a non-engaged position.

21. The method of claim 18, further comprising:
attaching the unit rack to a mounting frame.

* * * * *